US012313707B2

(12) United States Patent
Cuchet et al.

(10) Patent No.: US 12,313,707 B2
(45) Date of Patent: May 27, 2025

(54) MAGNETORESISTIVE SENSOR ELEMENT HAVING COMPENSATED TEMPERATURE COEFFICIENT OF SENSITIVITY AND METHOD FOR MANUFACTURING SAID ELEMENT

(71) Applicant: Allegro MicroSystems, LLC, Manchester, NH (US)

(72) Inventors: Léa Cuchet, Moirans (FR); Andrey Timopheev, Vif (FR); Jeffrey Childress, San Jose, CA (US)

(73) Assignee: Allegro MicroSystems, LLC, Manchester, NH (US)

( * ) Notice: Subject to any disclaimer, the term of this patent is extended or adjusted under 35 U.S.C. 154(b) by 93 days.

(21) Appl. No.: 17/760,109

(22) PCT Filed: Jan. 29, 2021

(86) PCT No.: PCT/IB2021/050697
§ 371 (c)(1),
(2) Date: Aug. 4, 2022

(87) PCT Pub. No.: WO2021/156714
PCT Pub. Date: Aug. 12, 2021

(65) Prior Publication Data
US 2023/0066027 A1    Mar. 2, 2023

(30) Foreign Application Priority Data
Feb. 7, 2020 (EP) ..................... 20315015

(51) Int. Cl.
*G01R 33/00*     (2006.01)
*G01R 33/09*     (2006.01)

(52) U.S. Cl.
CPC ....... *G01R 33/0082* (2013.01); *G01R 33/098* (2013.01)

(58) Field of Classification Search
CPC .............. G01R 33/0082; G01R 33/098; G01R 33/0005; H01F 1/047
See application file for complete search history.

(56) References Cited

U.S. PATENT DOCUMENTS

| 2006/0255383 A1* | 11/2006 | Kaiser | .................... | H10N 50/85 257/295 |
| 2009/0079018 A1* | 3/2009 | Nagase | .................. | H10N 50/85 257/E29.323 |

(Continued)

FOREIGN PATENT DOCUMENTS

| JP | 2017-112375 A | 6/2017 |
| JP | 2017-228688 A | 12/2017 |

OTHER PUBLICATIONS

International Search Report for issued in Application No. PCT/IB2021/050697 dated Apr. 20, 2021.

(Continued)

*Primary Examiner* — Alvaro E Fortich
(74) *Attorney, Agent, or Firm* — DALY, CROWLEY, MOFFORD & DURKEE, LLP

(57) ABSTRACT

A magnetoresistive sensor element including: a reference layer having a pinned reference magnetization; a sense layer having a free sense magnetization comprising a stable vortex configuration reversibly movable in accordance to an external magnetic field to be measured; a tunnel barrier layer between the reference layer and the sense layer; wherein the sense layer includes a first ferromagnetic sense portion in contact with the tunnel barrier layer and a second ferromagnetic sense portion in contact with the first ferromagnetic sense portion; the second ferromagnetic sense portion including a dilution element in a proportion such that a temperature dependence of a magnetic susceptibility of the sense layer substantially compensates a temperature depen- (Continued)

dence of a tunnel magnetoresistance of the magnetoresistive sensor element. Also, a method for manufacturing the magnetoresistive sensor element.

14 Claims, 6 Drawing Sheets

(56) References Cited

U.S. PATENT DOCUMENTS

| | | | | |
|---|---|---|---|---|
| 2010/0284217 | A1* | 11/2010 | Ogimoto | H10N 50/10 365/213 |
| 2013/0230741 | A1* | 9/2013 | Wang | G01R 33/098 427/131 |
| 2015/0303373 | A1* | 10/2015 | Chen | H10N 50/01 257/421 |
| 2017/0371006 | A1* | 12/2017 | Ide | G01R 33/0082 |
| 2018/0164387 | A1* | 6/2018 | Raberg | G01R 33/098 |
| 2018/0284200 | A1 | 10/2018 | Chen et al. | |
| 2019/0304522 | A1* | 10/2019 | Tahmasebi | H10N 50/01 |

OTHER PUBLICATIONS

Written Opinion for PCT/IB2021/050697 dated Apr. 20, 2021.
Japanese Office Action (with Machine English Translation) dated Oct. 17, 2024 for Japanese Application No. 2022-538853; 4 Pages.
Korean Office Action (with English Translation) dated Feb. 20, 2025 for Korean Application No. 10-2022-7022081; 13 Pages.
Response (with Machine English Translation from Espacenet.com) to Japanese Office Action dated Oct. 17, 2024 for Japanese Application No. 2022-538853; Response Filed Dec. 11, 2024; 15 Pages.
Japanese Notice of Allowance (with Machine English Translation from Espacenet.com) dated Feb. 4, 2025 for Japanese Application No. 2022-538853; 8 Pages.
Response (with Machine English Translation) to Korean Office Action dated Feb. 20, 2025 for Korean Application No. 10-2022-7022081; Response Filed Apr. 1, 2025; 34 Pages.

* cited by examiner

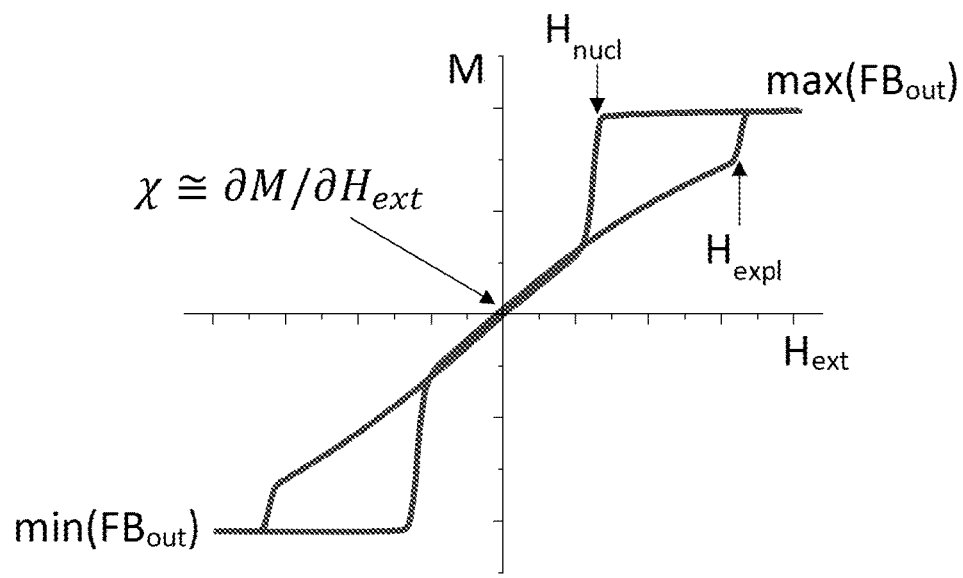
Fig. 3
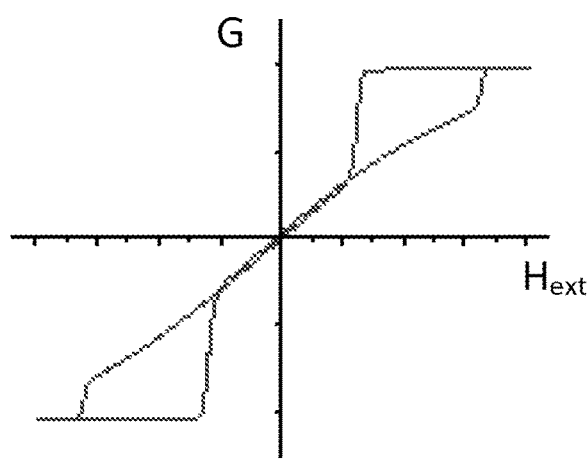 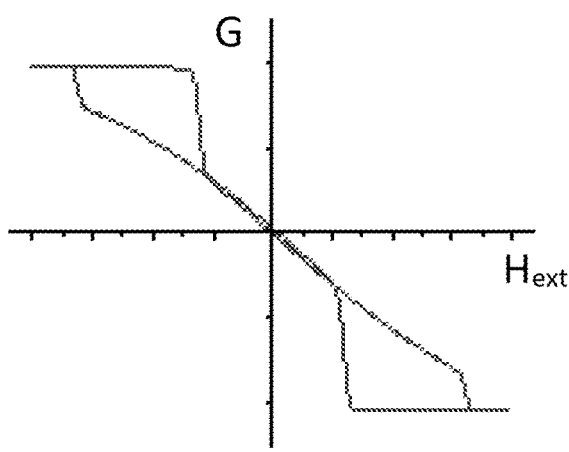
Fig. 4a                Fig. 4b

MAGNETORESISTIVE SENSOR ELEMENT HAVING COMPENSATED TEMPERATURE COEFFICIENT OF SENSITIVITY AND METHOD FOR MANUFACTURING SAID ELEMENT

FIELD

The present invention relates to a magnetoresistive sensor element for a magnetic sensor destined to sense an external magnetic field and a method for manufacturing the magnetoresistive sensor element.

DESCRIPTION OF RELATED ART

FIG. 1 shows a cross-section view of a magnetoresistive sensor element 2 comprising a ferromagnetic reference layer 23 including a first ferromagnetic layer 231 having a first reference magnetization 234 and a second ferromagnetic layer 232 having a second reference magnetization 235, a ferromagnetic sense layer 21 having a free sense magnetization 210 and a tunnel barrier layer 22 between the sense and reference ferromagnetic layers 21, 23. The sense magnetization 210 can be oriented in an external magnetic field 60 while the reference magnetizations 234, 235 remain substantially undisturbed. The external magnetic field 60 can thus be sensed by measuring a resistance of the magnetoresistive sensor element 2. The resistance depends on the relative orientation of the sense magnetization and the reference magnetization. Note that the reference layer 23 could comprise a single reference layer having a pinned reference magnetization.

FIGS. 2a and 2b illustrate a top view of the sense layer 21, wherein the sense magnetization 210 comprises a stable vortex configuration having a core 213 reversibly movable in accordance to the external magnetic field 60. The vortex configuration provides a linear and non-hysteretic behavior in a large magnitude range of the external magnetic field 60, for practical size of the magnetoresistive sensor element 2 and thickness of the sense layer 21. The vortex configuration is thus advantageous for 1D magnetic sensor applications. The obtention of a vortex configuration in the sense layer 21 depends on a number of factors, including materials properties of the sense layer 21. Generally, the vortex configuration is favored (at zero applied field) by increasing the aspect ratio of the thickness on the diameter of the sense layer 21. The aspect ratio is still typically much less than 1 (for example 0.01 to 0.5). More particularly, FIG. 2a shows the sense magnetization 210 in absence of the external magnetic field 60 with the core 213 of the vortex configuration being substantially at the center of the sense layer cross-section. In this configuration, the sense layer 21 has a net magnetic moment that is substantially zero (M=0). FIG. 2b shows the sense magnetization 210 in the presence of the external magnetic field 60. The external magnetic field 60 causes the core 213 to move in a direction (shown by the doted arrow) substantially perpendicular to the one of the external magnetic field 60. The displacement of the core 213 results in a net magnetic moment (M #0) in the sense layer 21. In particular, a displacement of the core 213 towards the right (as shown in FIG. 2b) results in a net magnetic moment M>0 in the sense layer 21, whereas a displacement of the core 213 towards the left (not shown), when the external magnetic field 60 is oriented opposed to the direction shown in FIG. 2b, results in a net magnetic moment M<0 in the sense layer 21.

FIG. 3 shows an hysteresis response (or magnetization curve) to the external magnetic field 60 ($H_{ext}$, in arbitrary unit) on the sense magnetization 210 (M, in arbitrary unit). The full hysteresis loop of a vortex sense magnetization 210 is characterized by a linear increase of magnetization M with the applied magnetic field $H_{ext}$ until the vortex expulsion field is reached at the $H_{expl}$ point. At this point the sense magnetization 210 becomes magnetically saturated. To recover the vortex state in the sensing layer 21, one needs to reduce the magnetic field below the nucleation field $H_{nucl}$. As long as the applied magnetic field is within the magnitudes corresponding to the expulsion field ($+/-H_{expl}$) of the vortex in the sense magnetization 210, the hysteresis response to the external magnetic field 60 comprises a reversible linear portion corresponding to the movement of the core 213 with the external magnetic field 60. The values and the slope of the linear part of hysteresis loop are strongly dependent on the size of the sense layer 21. The linear and non-hysteretic portion of the magnetization curve facilitates the measurement of small variations of the external magnetic field $H_{ext}$.

In particular, the vortex is characterized by its susceptibility $\chi$, which corresponds to the slope of the linear region of the M(H) loop:

$$\chi = \partial M / \partial H_{ext} \tag{1}$$

The sensitivity S of the magnetoresistive sensor element 2 then will be proportional to the product between the susceptibility $\chi$ and the tunnel magnetoresistance (TMR) of the magnetoresistive sensor element 2:

$$S = \chi * TMR \tag{2}$$

FIGS. 4a and 4b show the electrical conductance G (in arbitrary unit) of the magnetoresistive sensor element 2 as a function of the external magnetic field 60 ($H_{ext}$, in arbitrary unit). FIG. 4a reports the electrical conductance G when the sense magnetization 210 is parallel to the first reference magnetization 234, while FIG. 4b reports the electrical conductance G when the sense magnetization 210 is anti-parallel to the first reference magnetization 234. The electrical conductance G of the magnetoresistive sensor element 2 can be measured by passing a read current 31 (see FIG. 1) through the magnetoresistive sensor element 2. Because the electrical conductance G of the magnetoresistive sensor element 2 is proportional to the projection of averaged sense magnetization 210 onto the direction of the first reference magnetization 234, the electrical conductance G versus the external magnetic field $H_{ext}$ is similar to the hysteresis response (of FIG. 3) when the external magnetic field $H_{ext}$ is aligned with the direction of the first reference magnetization 234.

However, both the susceptibility $\chi$ and the TMR vary as a function of temperature T. In particular, when the temperature T increases, the sense magnetization 210 decreases which leads to an increase of the susceptibility $\chi$. On the other hand, the TMR diminishes when the temperature T is increased. The temperature dependence of the magnetoresistive sensor element 2 can be characterized by the temperature coefficient of sensitivity (TCS) which corresponds to the variation of sensitivity S with temperature T. FIG. 5 reports the ratio of the sense magnetization M on the saturated sense magnetization Ms (in arbitrary unit) as a function of the external magnetic field $H_{ext}$ (in arbitrary unit), measured for several temperatures in the magnetoresistive sensor element 2. The slope of the linear region, and thus the susceptibility $\chi$, increases which temperature. FIGS. 6a to 6c report measured conductance curves, i.e., the electrical conductance G (in arbitrary unit) of the magnetoresistive sensor element 2 as a function of the external magnetic field $H_{ext}$ (in arbitrary unit), for three increasing temperatures T (from FIG. 6a to FIG. 6c). FIGS. 6a to 6c show that the TMR decreases with increasing temperature. The TMR represents the maximum change of resistance (or inverse conductance) of the magnetoresistive sensor element 2 as a function of the external magnetic field $H_{ext}$.

In most cases, when the temperature is increased the TMR decreases faster than the susceptibility $\chi$ increases, which leads to large negative TCS. TCS of the magnetoresistive sensor element 2 is thus a very important parameter which can affect the sensing performance of the magnetoresistive sensor element 2 and the range of its potential real-life application.

The TCS can be controlled by using an electronic circuit which compensates change of the sensitivity S of the magnetoresistive sensor element 2 by changing the magnetoresistive element bias voltage with respect to the temperature change. This solution however requires trimming to adjust the TCS. Moreover, using an additional electronic circuit requires larger die size, making the process and development of the magnetoresistive sensor element 2 more complicated.

Document US2018164387 discloses a magnetic sensor comprising: a reference layer having a pinned reference magnetization; a sense layer having a free sense magnetization comprising a stable vortex configuration having a core reversibly movable in accordance to an external magnetic field to be measured; a tunnel barrier layer between the reference layer and the sense layer.

Document US2017371006 discloses a GMR element comprising a fixed magnetic layer, a nonmagnetic material layer, a free magnetic layer exchange-coupled with a first antiferromagnetic layer. The free magnetic layer is formed of a first ferromagnetic layer and a magnetic adjustment layer. The magnetic adjustment layer contains at least one iron group element and at least one platinum group element. The magnetic adjustment layer decreases the saturation magnetization of the free magnetic layer and, as a result, increases the magnitude of an exchange coupling bias Hex of the exchange coupling between the free magnetic layer and the first antiferromagnetic layer.

SUMMARY

The present disclosure concerns a magnetoresistive sensor element for sensing a one dimensional (1D) external magnetic field, the magnetoresistive sensor element comprising: a reference layer having a pinned reference magnetization; a sense layer having a free sense magnetization comprising a stable vortex configuration having a core reversibly movable in accordance to the external magnetic field; a tunnel barrier layer between the reference layer and the sense layer, the tunnel barrier layer comprising an insulating material; the sense layer comprising a first ferromagnetic sense portion in contact with the tunnel barrier layer and a second ferromagnetic sense portion in contact with the first ferromagnetic sense portion; the second ferromagnetic sense portion comprising a transition metal element in a proportion such that a temperature dependence of a magnetic susceptibility of the sense layer substantially compensates a temperature dependence of a tunnel magnetoresistance of the magnetoresistive sensor element.

The present disclosure further concerns a method for manufacturing the magnetoresistive sensor element, the method comprising, for a plurality of temperatures and proportion of the transition metal element:

measuring an electrical conductance G of the magnetoresistive sensor element as a function of the external magnetic field for a plurality of temperatures, such as to obtain a plurality of measured conductance curve for each temperature;

calculating a value of TMR of the magnetoresistive sensor element from the plurality of measured conductance curves such as to determine the temperature dependence of TMR; and measuring a magnetization of the sense layer, such as to determine the temperature dependence of the magnetic susceptibility of the sense layer; and determining the proportion of the transition metal element for which the temperature dependence of TMR substantially compensates the temperature dependence of the magnetic susceptibility.

The magnetoresistive sensor element disclosed herein has a minimal temperature dependence of sensitivity, or minimal TCS. The magnetoresistive sensor element does not require adding extra on-board electronics to compensate the loss of sensitivity by adapting the bias-voltage for each temperature. The magnetoresistive sensor element can have a small die size and does not require extra testing time.

BRIEF DESCRIPTION OF THE DRAWINGS

The invention will be better understood with the aid of the description of an embodiment given by way of example and illustrated by the figures, in which:

FIG. 3 shows the full hysteresis response to the external magnetic field on the sense magnetization;

FIGS. 4a and 4b show the electrical conductance of the magnetoresistive sensor element as a function of the external magnetic field, when the sense magnetization is parallel (FIG. 4a) and antiparallel (FIG. 4b) to the reference magnetization;

DETAILED DESCRIPTION OF POSSIBLE EMBODIMENTS

Figure 1:
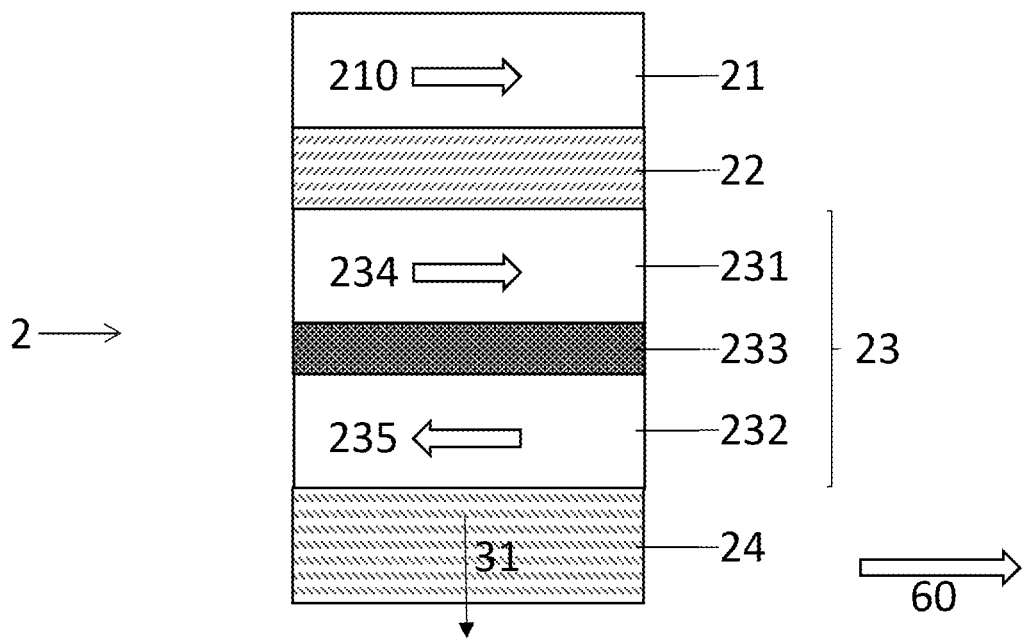
FIG. 1 shows a cross-section view of a magnetoresistive sensor element comprising a sense layer.
Figures 2A, 2B:
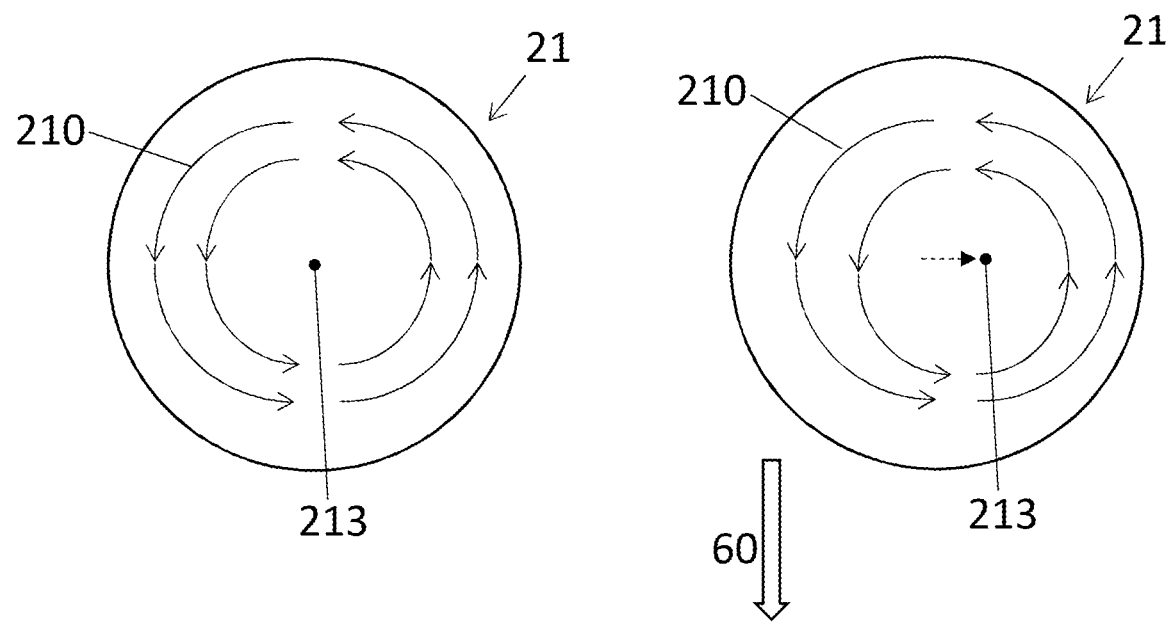
FIGS. 2a and 2b illustrate a top view of the sense layer having a sense magnetization comprising a vortex configuration movable in an external magnetic field.
Figure 5:
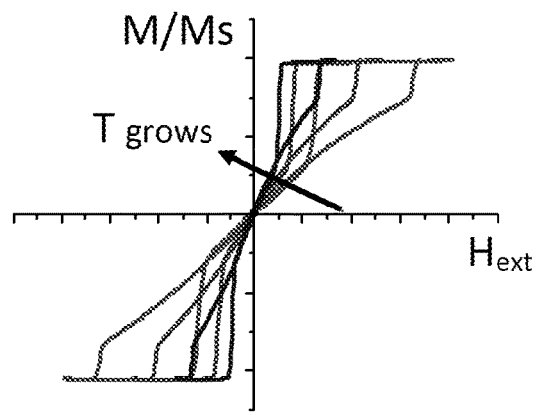
FIG. 5 reports the ratio of the sense magnetization over the saturated sense magnetization as a function of the external field, measured for several temperatures in the magnetoresistive sensor element.

Referring to FIG. 1, a magnetoresistive sensor element 2 according to an embodiment comprises a ferromagnetic reference layer 23 having a pinned reference magnetization 230, a ferromagnetic sense layer 21 having a sense magnetization 210 that is movable in accordance to the external magnetic field 60, and a tunnel barrier layer 22 between the sense and reference ferromagnetic layers 21, 23. The sense magnetization 210 comprises a stable vortex configuration having a core 213 reversibly movable in accordance to the external magnetic field 60 (see FIGS. 2a and 2b).

The ferromagnetic layers can be made of an iron (Fe) based alloy, such as an alloy of cobalt and iron (CoFe), an allow of nickel and iron (NiFe), or an alloy of cobalt, iron, and boron (CoFeB). The reference layer can be pinned by an antiferromagnetic layer 24 by magnetic exchange bias coupling. The antiferromagnetic layer can comprise an alloy based on manganese Mn, such as alloys based on iridium Ir and Mn (e.g., IrMn); alloys based on Fe and Mn (e.g., FeMn); alloys based on platinum Pt and Mn (e.g., PtMn); and alloys based on Ni and Mn (e.g., NiMn). The reference layer 23 can comprise one or a plurality of ferromagnetic layers or, as illustrated in FIG. 1, the reference layer 23 can comprise a synthetic antiferromagnet (SAF) comprising at least a first ferromagnetic layer 231 separated from a second ferromagnetic layer 232 by an antiparallel coupling layer 233 comprising of: ruthenium (Ru), Ir or copper (Cu) or a combination of these elements. A second reference magnetization 235 of the ferromagnetic layer 232 adjacent to the antiferromagnetic layer 24 is pinned and a first reference magnetization 234 of the first ferromagnetic layer 231 is coupled antiparallel to the second reference magnetization 235 by the antiparallel coupling layer 233. The tunnel barrier 22 can comprise an insulating material. Suitable insulating materials include oxides, such as aluminum oxide (e.g., $Al_2O_3$) and magnesium oxide (e.g., MgO). A thickness of the tunnel barrier layer 22 can be in the nanometer (Nm) range, such as from about 1 nm to about 3 nm.

Figure 7:
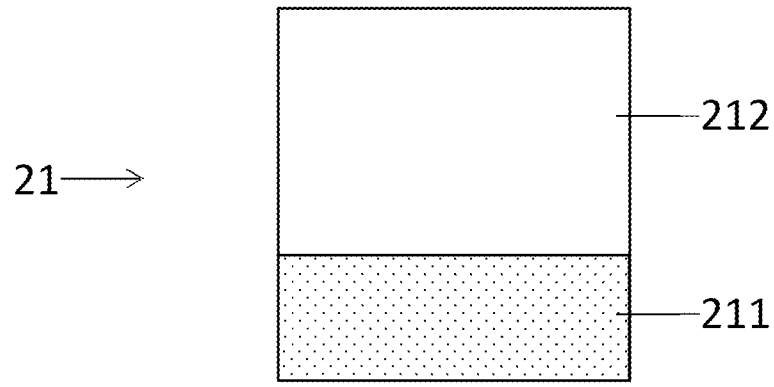
FIG. 7 shows a detail of the sense layer 21 comprising a first ferromagnetic sense portion and a second ferromagnetic sense portion, according to an embodiment.

FIG. 7 shows a detail of the sense layer 21, according to an embodiment. The sense layer 21 comprises a first ferromagnetic sense portion 211 in contact with the tunnel barrier layer 22 and a second ferromagnetic sense portion 212 in contact with the first ferromagnetic sense portion 211. The second ferromagnetic sense portion 212 comprises a dilution element in a proportion such that a temperature dependence of a magnetic susceptibility $\chi$ of the sense layer 21 substantially compensates a temperature dependence of a tunnel magnetoresistance TMR of the magnetoresistive sensor element 2. The second ferromagnetic sense portion 212 should be thick enough to allow for a vortex state (to be adapted to the device size).

Figure 8:
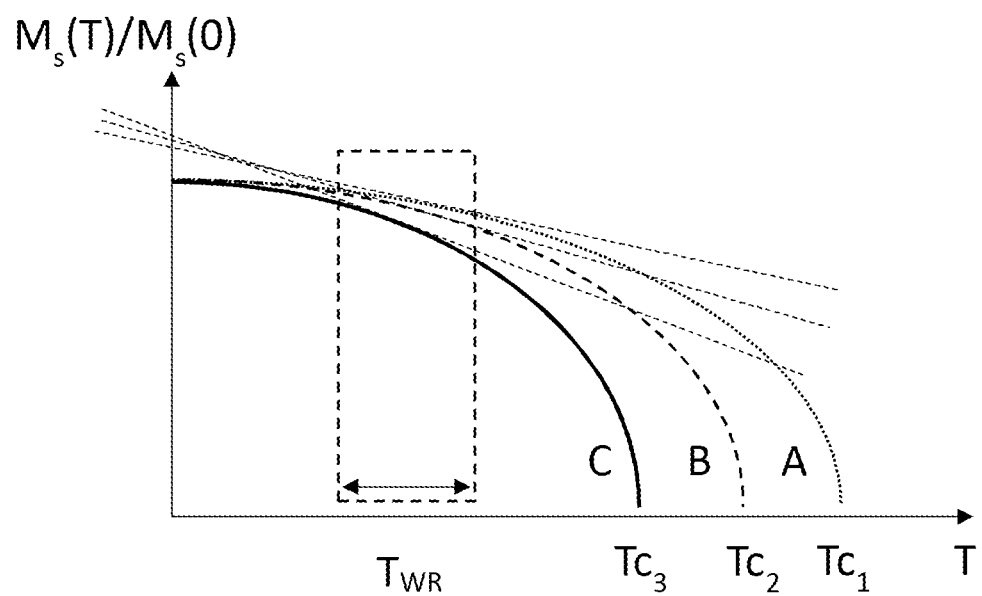
FIG. 8 shows the saturation magnetization as a function of temperature for different dilution of the sense magnetization.

The dilution element dilutes the sense magnetization 210 and decreases the Curie temperature Tc of the sense layer 21. FIG. 8 shows the saturation magnetization normalized at 0K $M_s(T)/M_s(0)$ as a function of temperature T for undiluted sense magnetization (curve A) having a first Curie temperature $Tc_1$, moderately diluted sense magnetization (curve B) having a second Curie temperature $Tc_2$ smaller than the first Curie temperature $Tc_1$, and highly diluted sense magnetization (curve C) having a third Curie temperature $Tc_3$ smaller than the second Curie temperature $Tc_2$.

Also shown in FIG. 8 is the tangent at a median point of the curves A to C within a working temperature range $T_{WR}$. The working temperature range $T_{WR}$ is shown by the dotted box in FIG. 8 and corresponds to temperatures at which the magnetoresistive sensor element 2 is typically operated. The tangent for curves A to C show that decreasing the Curie temperature Tc of the sense layer 21 results in a faster drop in magnetization with increasing temperature T in the working temperature range $T_{WR}$. The faster drop in magnetization with increasing temperature T results in a faster increase of the susceptibility $\chi$ with increasing temperature.

By adjusting the dilution of the sense magnetization 210 it is possible to substantially compensate the decrease of the TMR with the increase of the susceptibility $\chi$ with increasing temperature. Adjusting the dilution of the sense magnetization 210 thus allows for controlling the TCS, for example making the TCS to be substantially null in the working temperature range $T_{WR}$. Here, dilution of the sense magnetization 210 is achieved by adding a dilution element in the ferromagnetic material forming the second ferromagnetic sense portion 212.

In an embodiment, the dilution element is a transition metal element. For example, the second ferromagnetic sense portion 212 can comprise a NiFe alloy including a transition metal element. The transition element can include for instance tantalum (Ta), tungsten (W), or Ru.

Figure 9:
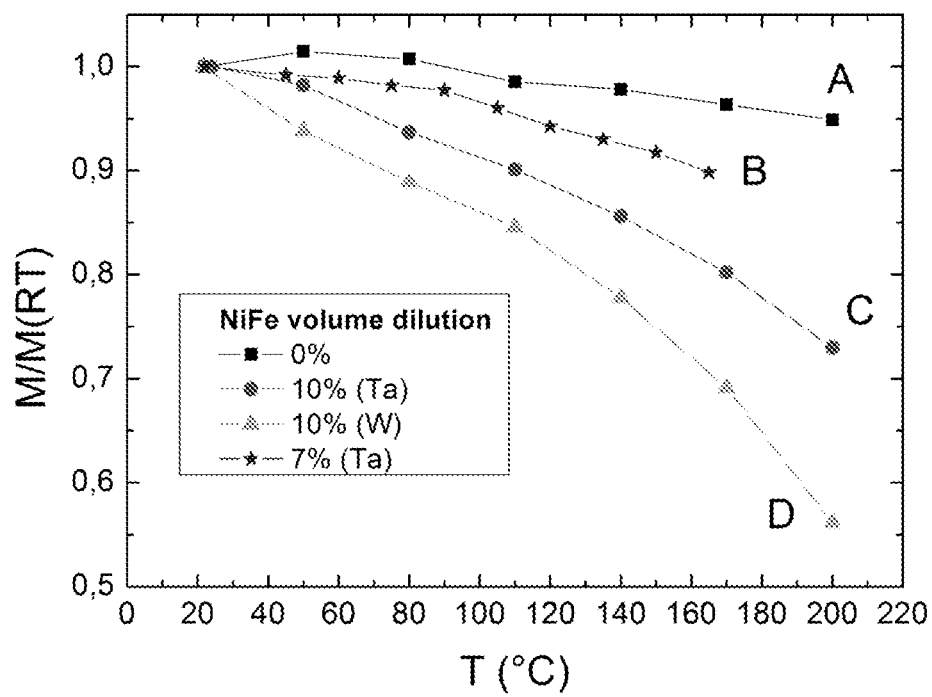
FIG. 9 reports experimentally measured saturation magnetization as a function of temperature for the sense layer, the second ferromagnetic sense portion comprising NiFe alloy for different content of a transition metal element.
Figure 10:
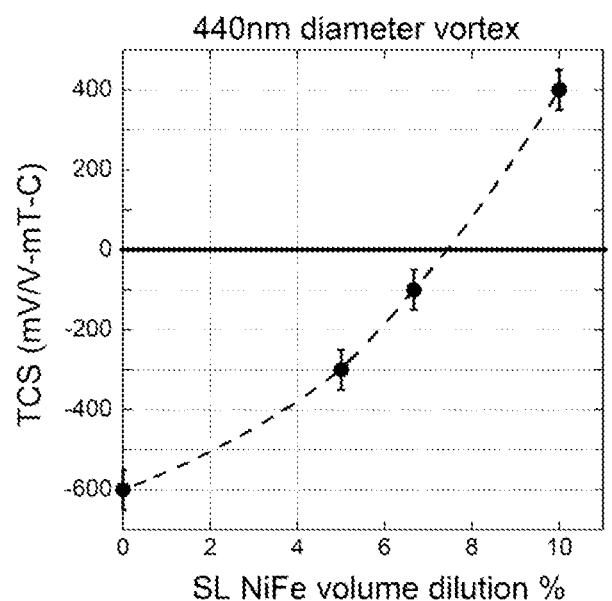
FIG. 10 reports TCS values for various dilution achieved by adding Ta in the NiFe alloy of the second ferromagnetic sense portion.

FIG. 9 reports the measured saturation magnetization normalized at room temperature M/M (RT) as a function of temperature T for the sense layer 21 in which the second ferromagnetic sense portion 212 comprises a NiFe alloy for different content of the dilution element included in the layer. Magnetization curves are reported for no dilution (curve A), a concentration of 10% volume (vol.) of Ta (curve C), a concentration of 10% vol. of W (curve D) and a concentration of 7% vol. of Ta (curve B). FIG. 10 shows that the inclusion of Ta in the NiFe alloy of the second ferromagnetic sense portion 212 leads to a faster decrease of the magnetization with temperature T. Adding W to the second ferromagnetic sense portion 212 yields a stronger decrease of the magnetization with temperature T than when Ta is added.

FIG. 10 reports TCS values for various dilution achieved by adding Ta in the NiFe alloy of the second ferromagnetic sense portion 212 having a vortex configuration of the sense magnetization 210 having a diameter of about 440 nm. The TCS is substantially compensated (TCS approaching a null value) for a concentration of about 8% vol. of Ta in the NiFe alloy.

Figure 11:
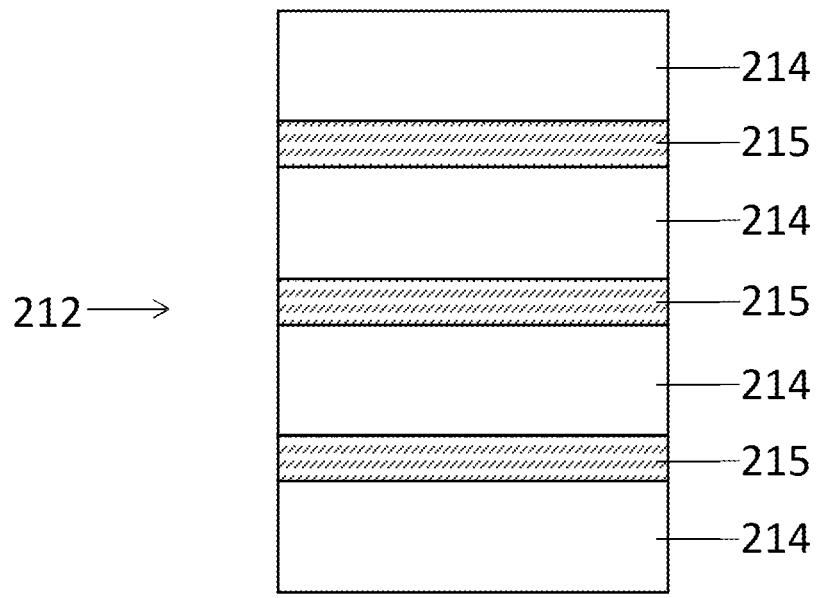
FIG. 11 shows a detail of the second ferromagnetic sense portion, according to an embodiment.

In an embodiment shown in FIG. 11, the second ferromagnetic sense portion 212 comprises a plurality of ferromagnetic sub-layers 214 comprising a ferromagnetic alloy and a plurality of dilution sub-layers 215 the dilution element, for example comprising a transition metal element. The ferromagnetic sub-layer 214 can have a thickness that is 0.5 nm or above. For example, the ferromagnetic sub-layer 214 can have a thickness between 0.5 and 5 nm. The dilution sub-layers 215 can have a thickness between 0.1 and 0.5 nm.

The ferromagnetic sub-layer 214 can comprise an NiFe, a CoFe or a CoFeB alloy.

The first ferromagnetic sense portion 211 can comprise a CoFeB alloy.

In one particular example, the first ferromagnetic sense portion 211 comprises a CoFeB alloy and the second ferromagnetic sense portion 212 comprises a plurality of ferromagnetic sub-layers 214 comprising a ferromagnetic NiFe alloy and a plurality of dilution sub-layers 215 comprising Ta. Here, the first ferromagnetic sense portion 211 can have a thickness of about 2.4 nm, the ferromagnetic sub-layers 214 can have a thickness of about 1.2 nm and the dilution sub-layers 215 can have a thickness of about 0.1 nm.

According to an embodiment, a method for manufacturing the magnetoresistive sensor element 2 comprises, for a plurality of temperatures and concentrations of the dilution element, performing the steps of:

measuring an electrical conductance G of the magnetoresistive sensor element 2 as a function of the external magnetic field $H_{ext}$ for a plurality of temperatures T, such as to obtain a plurality of measured conductance curves for each temperature T;

calculating a value of TMR of the magnetoresistive sensor element 2 from the plurality of measured conductance curves, such as to determine the temperature dependence of TMR; and measuring the magnetization of the sense layer 21, such as to determine the temperature dependence of the magnetic susceptibility $\chi$ of the sense layer 21.

Figures 6A, 6B, 6C:
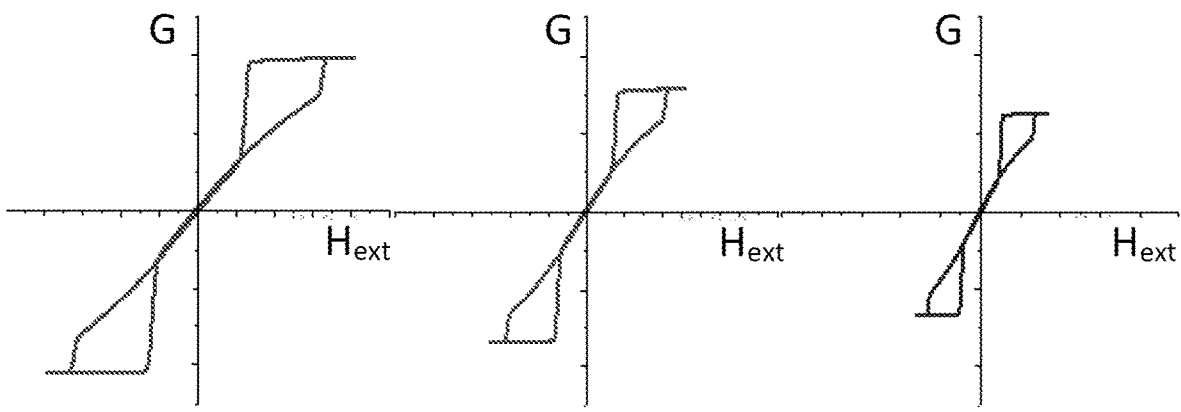
FIGS. 6a to 6c report the electrical conductance of the magnetoresistive sensor element as a function of the external magnetic field for increasing temperatures.

The electrical conductance G of the magnetoresistive sensor element 2 can be measured by passing a read current 31 (see FIG. 1) through the magnetoresistive sensor element 2. Examples of measured conductance curve for three different temperatures T are shown if FIGS. 6a-6c.

From the preformed steps, the method further comprises a step of determining the proportion of the diluting element for which the temperature dependence of TMR substantially compensates the temperature dependence of the magnetic susceptibility $\chi$.

To compensate the TCS, the change of magnetization Ms(T) with temperature T should follow:

$$Ms(T)=A\text{TMR}(T)/(2+\text{TMR}(T)) \quad (3)$$

where A is a constant and TMR(T) if the temperature dependence of TMR.

Figure 12:
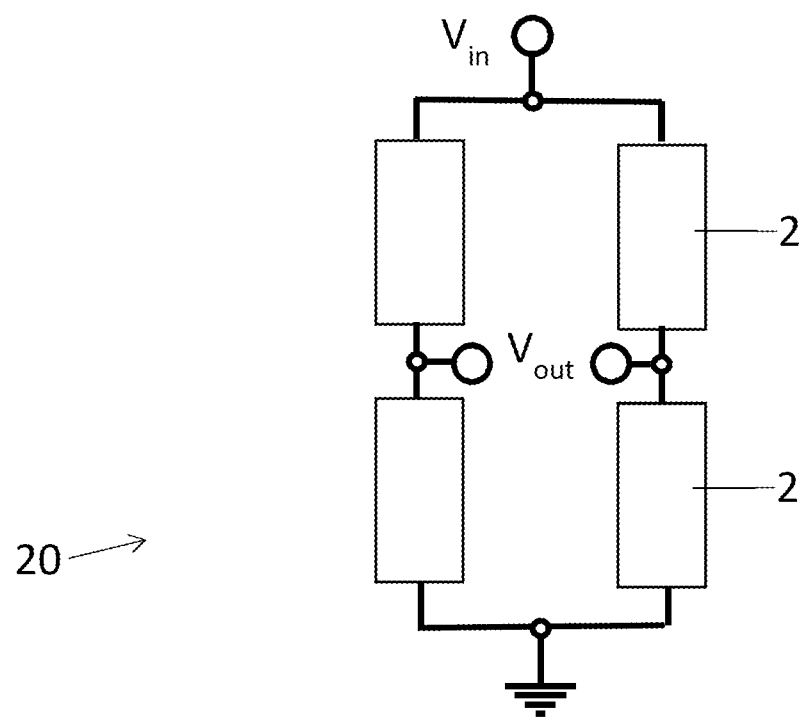
FIG. 12 presents a Wheastone bridge configuration in which four magnetoresistive elements are used to create a magnetoresistive sensor, according to an embodiment.

A magnetoresistive sensor for sensing a 1D external magnetic field $H_{ext}$ can comprises a plurality of the magnetoresistive sensor element 2. In one embodiment illustrated in FIG. 12, the magnetoresistive sensor 20 is arranged in a Wheatstone full-bridge configuration. This can improve sensor thermal stability and linearity. Inside such a full bridge, the diagonal elements 2 have the same response curve (FIG. 4a, for example) while in each half-bridge there is one sensing element with response curve 4a and the other with the reversed response curve (FIG. 4b). This is achieved by having opposite directions of the reference layer 230 for the two sensing elements 2 having response curve like the one of FIG. 4a and FIG. 4b, respectively.

In the case where the magnetoresistive sensor 20 is biased with 1 V ($V_{in}=1V$), the temperature dependence of TMR can be calculated from the electrical output $V_{out}$ of the magnetoresistive sensor 20 at the the saturation magnetization $FB_{out}$ in the hysteresis curve (see for example FIG. 3), by using:

$$\text{TMR}=2FB_{out}/(FB_{out}-2), \text{ where } FB_{out}=\max(FB_{out})-\min(FB_{out}) \quad (4),$$

where $\max(FB_{out})$ and $\min(FB_{out})$ is the saturation magnetization in the hysteresis curve.

The change of magnetization Ms(T) with temperature T can be measured independently on the sense layer 21 using a magnetometer.

REFERENCE NUMBERS AND SYMBOLS 2 magnetoresistive sensor element
20 magnetoresistive sensor
21 sense layer
210 sense magnetization
211 first ferromagnetic sense portion
212 second ferromagnetic sense portion
213 core
214 ferromagnetic sub-layer
215 dilution sub-layer
22 tunnel barrier layer
23 reference layer
230 reference magnetization
231 first ferromagnetic layer
232 second ferromagnetic layer
233 antiparallel coupling layer
234 first reference magnetization
235 second reference magnetization
24 antiferromagnetic layer
31 read current
60 external magnetic field
G electrical conductance
$H_{ext}$ external magnetic field
$H_{expl}$ expulsion field
$H_{nucl}$ nucleation field
Ms saturation magnetization
S sensitivity
T temperature
Tc Curie temperature
TCS temperature coefficient of sensitivity
TMR tunnel magnetoresistance
$T_{WR}$ working temperature range
$\chi$ magnetic susceptibility

The invention claimed is:

1. A tunneling magnetoresistance (TMR) sensor element comprising:
    a reference layer having a pinned reference magnetization;
    a sense layer having a free sense magnetization comprising a stable vortex configuration having a core reversibly movable in accordance to an external magnetic field to be measured;
    a tunnel barrier layer between the reference layer and the sense layer, the tunnel barrier layer comprising an insulating material;
    wherein the sense layer comprises a first ferromagnetic sense portion in contact with the tunnel barrier layer and a second ferromagnetic sense portion in contact with the first ferromagnetic sense portion; and
    wherein the second ferromagnetic sense portion comprises an alloy and a dilution element, the dilution element having a concentration of 7-10% volume, the dilution element being arranged to compensate a temperature dependence of tunnel magnetoresistance of the TMR sensor element, the dilution element being a transition metal.

2. The TMR sensor element, according to claim 1, wherein the transition metal is selected from the group consisting of Ta (tantalum) and W (tungsten).

3. The TMR sensor element, according to claim 1, wherein the first ferromagnetic sense portion comprises an alloy of cobalt, iron and boron (CoFeB).

4. The TMR sensor element, according to claim 1, wherein the alloy comprises an alloy of nickel and iron (NiFe).

5. The TMR sensor element, according to claim 1, wherein the second ferromagnetic sense portion comprises a plurality of ferromagnetic sub-layers comprising the alloy and a plurality of dilution sub-layers comprising the dilution element.

6. The TMR sensor element, according to claim 5, wherein each of the ferromagnetic sub-layers is between 0.1 and 0.5 nanomenters (nm) in thickness and each ferromagnetic sub-layer is between 0.5 and 5 nm in thickness.

7. The TMR sensor element, according to claim 5, wherein any of the ferromagnetic sub-layers comprises an alloy of nickel and iron (NiFe), an alloy of cobalt and iron (CoFe), or an alloy of cobalt, iron, and boron (CoFeB).

8. A tunneling magnetoresistance (TMR) sensor for sensing a 1D external magnetic field, comprising a plurality of TMR sensor elements, each TMR sensor element comprising:
   a reference layer having a pinned reference magnetization;
   a sense layer having a free sense magnetization comprising a stable vortex configuration having a core reversibly movable in accordance to an external magnetic field to be measured;
   a tunnel barrier layer between the reference layer and the sense layer, the tunnel barrier layer comprising an insulating material;
   wherein the sense layer comprises a first ferromagnetic sense portion in contact with the tunnel barrier layer and a second ferromagnetic sense portion in contact with the first ferromagnetic sense portion; and
   wherein the second ferromagnetic sense portion comprises an alloy and a dilution element, the dilution element having a concentration of 7-10% volume, the dilution element being arranged to compensate a temperature dependence of tunnel magnetoresistance of the TMR sensor element, the dilution element being a transition metal.

9. The TMR sensor according to claim 8, arranged in a Wheatstone full-bridge configuration.

10. Method for manufacturing a tunneling magnetoresistance (TMR) sensor element, the method comprising:
   forming a reference layer having a pinned reference magnetization;
   forming a sense layer having a free sense magnetization comprising a stable vortex configuration having a core reversibly movable in accordance to an external magnetic field to be measured, the sense layer comprising a first ferromagnetic sense portion and a second ferromagnetic sense portion in contact with the first ferromagnetic sense portion, the second ferromagnetic sense portion comprising a dilution element in a proportion such that a temperature dependence of a magnetic susceptibility of the sense layer substantially compensates a temperature dependence of tunnel magnetoresistance (TMR) of the TMR sensor element;
   forming a tunnel barrier layer between the reference layer and the sense layer, the tunnel barrier layer comprising an insulating material, the tunnel barrier layer being in contact with the first ferromagnetic sense portion of the sense layer;
   wherein forming the sense layer includes determining a concentration for the dilution element, the concentration being determined by: measuring an electrical conductance of the TMR sensor element as a function of the external magnetic field for a plurality of temperatures, such as to obtain a measured conductance curve for each temperature; calculating a value of TMR of the TMR sensor element from the plurality of conductance curves, such as to determine the temperature dependence of TMR; and measuring a magnetization of the sense layer, such as to determine the temperature dependence of the magnetic susceptibility of the sense layer; and determining the concentration of the dilution element for which the temperature dependence of TMR substantially compensates the temperature dependence of the magnetic susceptibility.

11. The method according to claim 10, wherein the dilution element includes a transition metal.

12. The method according to claim 11, wherein the transition metal is selected from the group consisting of Ta (tantalum), W (tungsten) or Ru (Ruthenium) elements.

13. The method according to claim 10, wherein the first ferromagnetic sense portion comprises an alloy of cobalt, iron and boron (CoFeB).

14. The method according to claim 10, wherein the second ferromagnetic sense portion comprises an alloy of nickel and iron (NiFe) comprising the dilution element.

* * * * *